(12) United States Patent
Wang et al.

(10) Patent No.: US 8,089,160 B2
(45) Date of Patent: Jan. 3, 2012

(54) IC INTERCONNECT FOR HIGH CURRENT

(75) Inventors: Ping-Chuan Wang, Hopewell Junction, NY (US); Kimball M. Watson, Essex Junction, VT (US); Kai Xiu, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 605 days.

(21) Appl. No.: 11/954,866

(22) Filed: Dec. 12, 2007

(65) Prior Publication Data

US 2009/0152724 A1  Jun. 18, 2009

(51) Int. Cl.
*H01L 23/48* (2006.01)
*H01L 23/52* (2006.01)

(52) U.S. Cl. .............. 257/774; 257/758; 257/E23.145

(58) Field of Classification Search .............. 257/758, 257/774, E23.145
See application file for complete search history.

(56) References Cited

U.S. PATENT DOCUMENTS

| | | | | |
|---|---|---|---|---|
| 5,126,819 | A * | 6/1992 | Abe et al. ................. | 257/774 |
| 5,461,260 | A * | 10/1995 | Varker et al. ............. | 257/773 |
| 5,463,255 | A * | 10/1995 | Isono ....................... | 257/773 |
| 5,470,788 | A | 11/1995 | Biery et al. | |
| 5,506,450 | A * | 4/1996 | Lee et al. ................. | 257/767 |
| 5,689,139 | A * | 11/1997 | Bui et al. ................. | 257/758 |
| 5,712,510 | A * | 1/1998 | Bui et al. ................. | 257/758 |
| 6,346,749 | B1 * | 2/2002 | Umemura ................ | 257/774 |
| 6,552,434 | B2 | 4/2003 | Hasunuma et al. | |
| 6,992,002 | B2 | 1/2006 | Dunham et al. | |
| 7,458,053 | B2 | 11/2008 | Ruderer et al. | |
| 7,459,787 | B2 * | 12/2008 | Young ..................... | 257/758 |
| 7,501,690 | B2 | 3/2009 | Erturk et al. | |
| 2004/0140569 | A1 * | 7/2004 | Meguro et al. ........... | 257/776 |
| 2008/0203589 | A1 | 8/2008 | Bailey et al. | |

OTHER PUBLICATIONS

J. Lienig, "Interconnect and current density stress: an introduction to electromigration-aware design", Proc. Int. Workshop on Sys Lev Interconnect Prediction, 2005, pp. 81-88.
R. Otten et al., "Design Automation for Deepsubmicron: Present and Future", Proc. Conf. on Design, Automation and Test in Europe, 2002, pp. 650-657.
Wang et al., "Electromigration threshold in copper interconnects," American Institute of Physics, Applied Physics Letters, vol. 78, No. 23, Jun. 4, 2001, pp. 3598-3600.

* cited by examiner

*Primary Examiner* — Nitin Parekh
(74) *Attorney, Agent, or Firm* — Katherine S. Brown; Hoffman Warnick LLC

(57) ABSTRACT

An IC interconnect according to one embodiment includes a first via positioned in a dielectric and coupled to a high current device at one end; a buffer metal segment positioned in a dielectric and coupled to a top portion of the first via; and a plurality of second vias positioned in a dielectric and coupled to the buffer metal segment at a bottom end and to a metal power line at a top end thereof, wherein the first via is coupled to a first end of the buffer metal segment and the plurality of second vias are coupled to a second end of the buffer metal segment, such that the first via is horizontally off-set from all of the plurality of second vias, wherein the butter metal segment is substantially shorter in length than the metal power line.

7 Claims, 6 Drawing Sheets

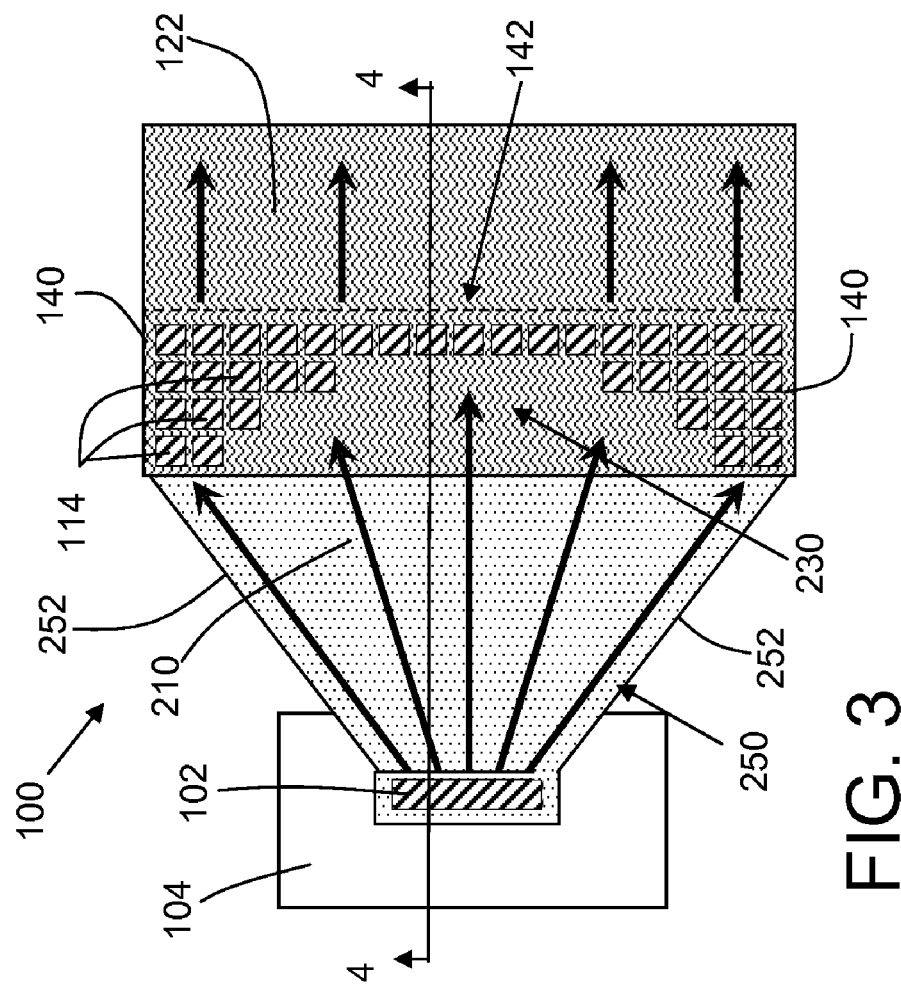
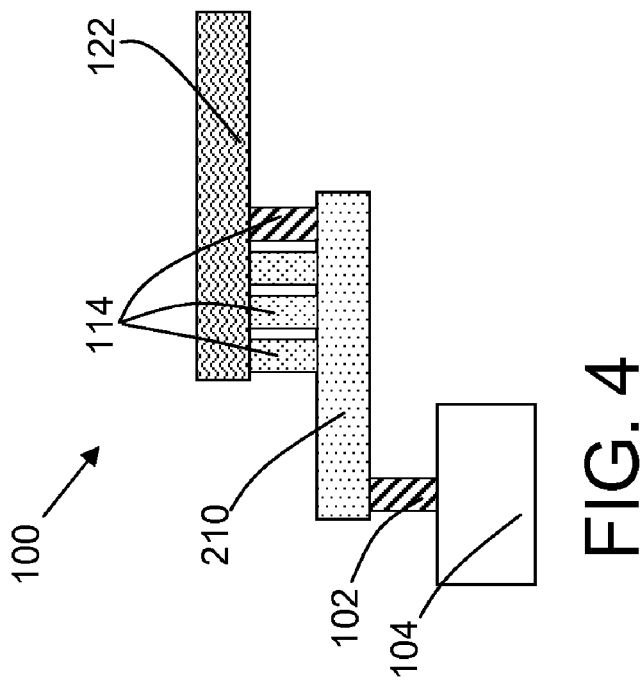
FIG. 3
FIG. 4

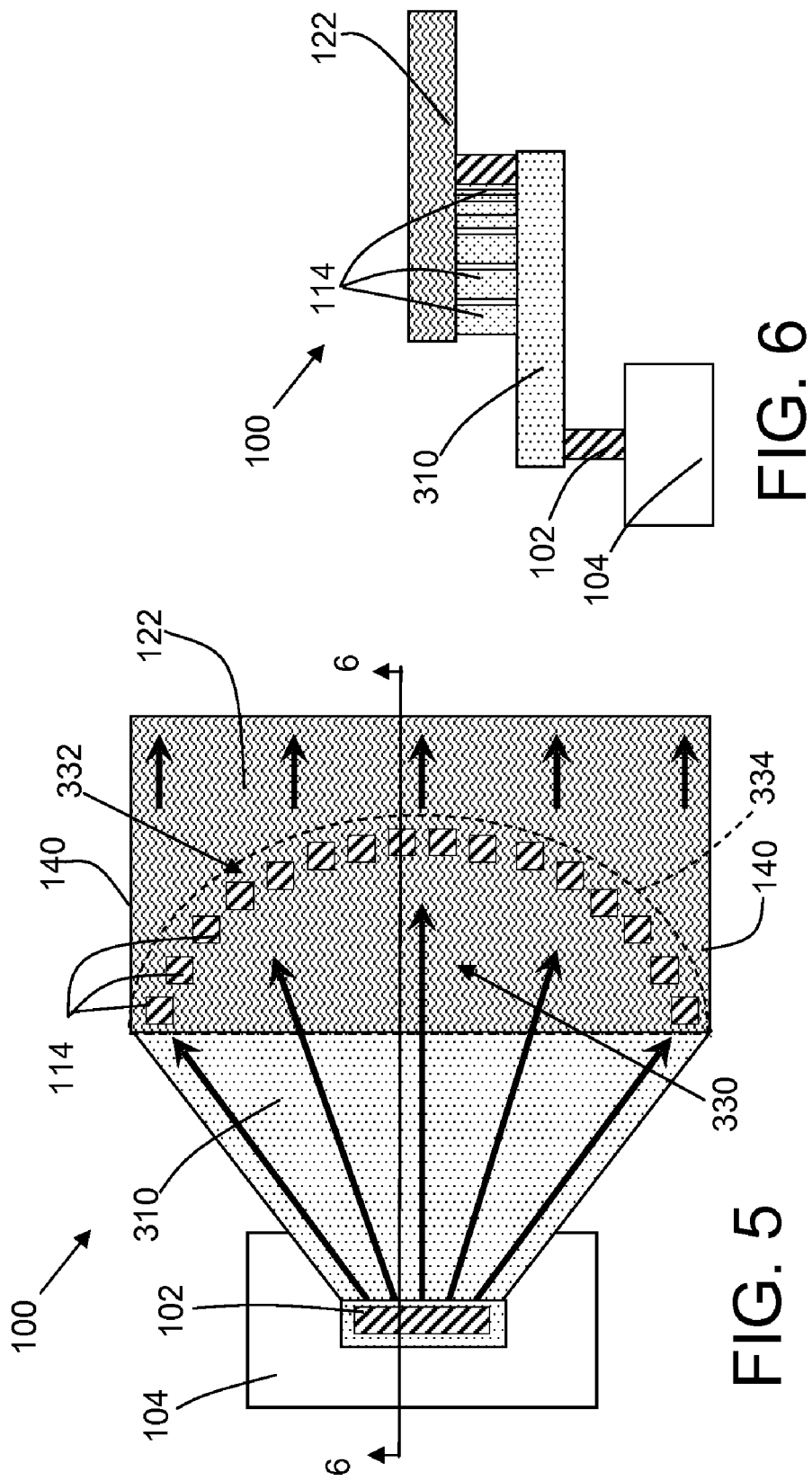

IC INTERCONNECT FOR HIGH CURRENT

BACKGROUND

1. Technical Field

The disclosure relates generally to integrated circuits (ICs), and more particularly, to an IC interconnect for high current.

2. Background Art

Back-end-of-line (BEOL) interconnects carry high direct current (DC) in advanced integrated circuit (IC) chip technology. As IC chip technology advances, self-heating by high current devices raises the temperature of nearby interconnects under circuit operation and makes use of high current carrying BEOL interconnects more challenging. For example, a device that uses high current and self-heats (e.g., a resistor, transistor, etc.) may heat up an interconnect that couples to the device. The high current leads to electromigration degradation of the interconnect (via and/or line), causing shorts or opens. As a result, the current-carrying capability (or the $I_{dc}$ limit specified in the design manuals) is significantly reduced to avoid electromigration degradation in interconnects. As an example, a direct current limit in a copper interconnect may be reduced by a factor of more than 3, resulting from a temperature rise of 15° C. from, for example, 85° C. to 100° C., and by almost a factor of 20 at a 125° C. interconnect temperature. As a result, high direct current at elevated temperatures is almost impossible with conventional interconnect wiring design.

Conventionally, the above-described situation is circumvented simply by widening the interconnect that is carrying the high current. However, this solution is hindered because of severe current crowding at the via/line contact interface, which is very susceptible to electromigration damage. In particular, the field distribution near the end of the metal line is typically not uniform, resulting in significant current crowding which is the main reason for causing electromigration degradation in interconnects.

SUMMARY

IC interconnect for high current device, design structure thereof and method are disclosed. One embodiment of the IC interconnect includes a first via positioned in a dielectric and coupled to a high current device at one end; a buffer metal segment positioned in a dielectric and coupled to the first via at the other end thereof; and a plurality of second vias positioned in a dielectric and coupled to the buffer metal segment at one end and to a metal power line at the other end thereof, wherein the buffer metal segment is substantially shorter in length than the metal power line.

A first aspect of the disclosure provides an integrated circuit (IC) interconnect comprising: a first via positioned in a dielectric and coupled to a high current device at one end; a buffer metal segment positioned in a dielectric and coupled to a top portion of the first via; and a plurality of second vias positioned in a dielectric and coupled to the buffer metal segment at a bottom end and to a metal power line at a top end thereof, wherein the first via is coupled to a first end of the buffer metal segment and the plurality of second vias are coupled to a second end of the buffer metal segment, such that the first via is horizontally off-set from all of the plurality of second vias, wherein the butter metal segment is substantially shorter in length than the metal power line.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 3 shows a top view of other embodiments of an IC interconnect according to the disclosure.

FIG. 4 shows a cross-sectional view along line 4-4 in FIG. 3.

FIG. 5 shows a top view of another embodiment of an IC interconnect according to the disclosure.

FIG. 6 shows a cross-sectional view along line 6-6 in FIG. 5.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
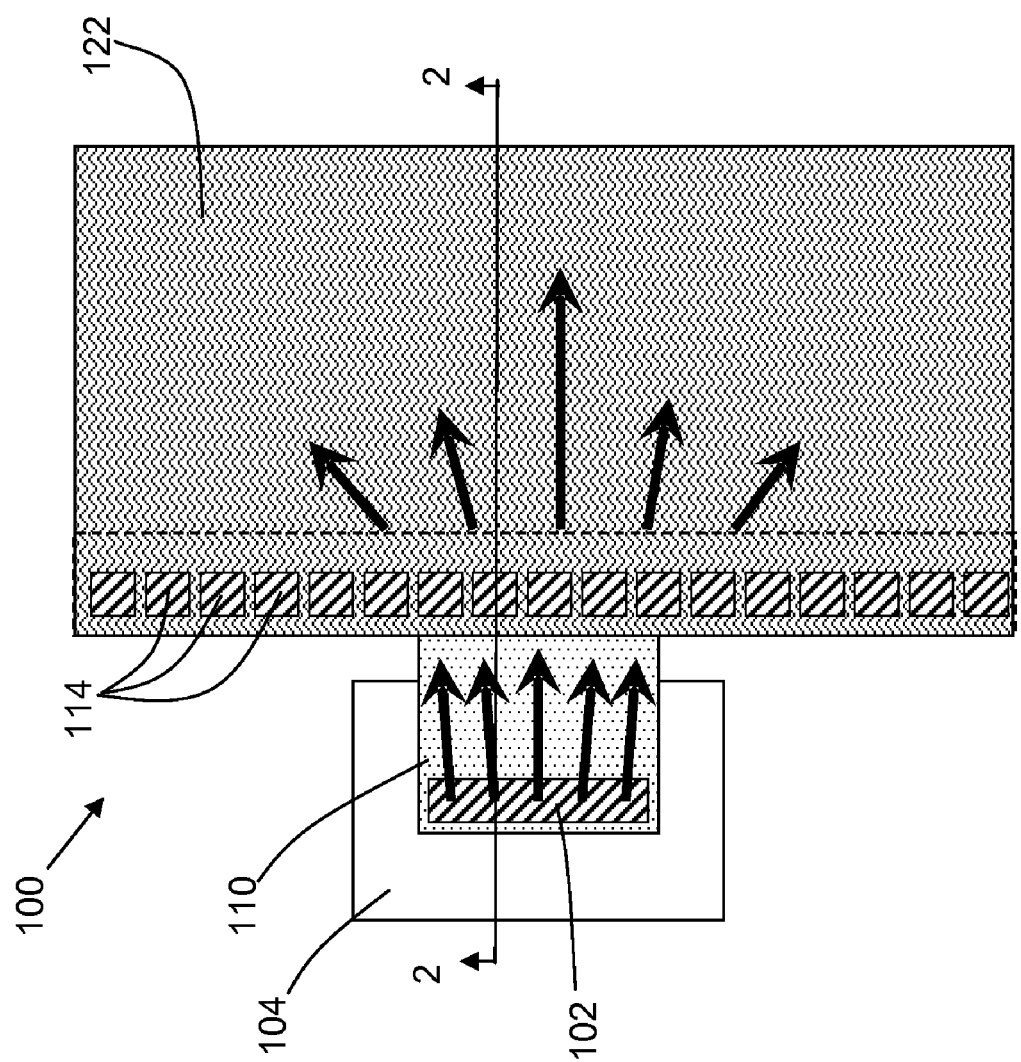
FIG. 1 shows a top view of embodiments of an IC interconnect according to the disclosure.
Figure 2:
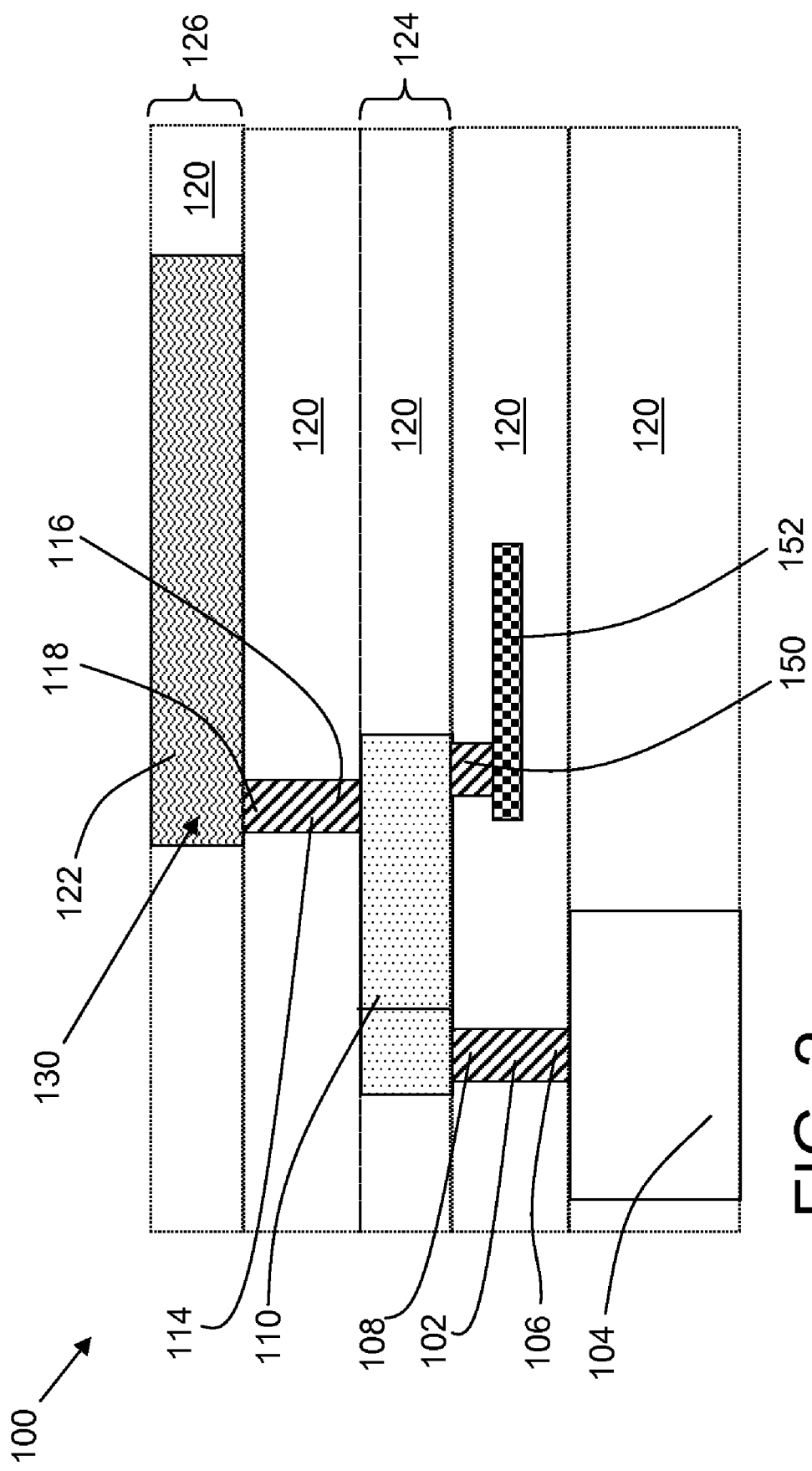
FIG. 2 shows cross-sectional view along line 2-2 in FIG. 1.

FIGS. 1-6 show various embodiments of an integrated circuit (IC) interconnect 100 according to the disclosure. Referring to FIGS. 1-2, FIG. 1 shows a top view of an interconnect 100, while FIG. 2 shows a cross-sectional view along line 2-2 in FIG. 1. As shown in FIGS. 1-2, each IC interconnect 100 includes a first via 102 positioned in a dielectric 120 and coupled to a high current device 104 at one end 106. A buffer metal segment 110 is positioned in a dielectric 120 and coupled to first via 102 at the other end 108 thereof. A plurality of second vias 114 are positioned in a dielectric 120 and coupled to buffer metal segment 110 at one end 116 and to a metal power line 122 at the other end 118 thereof. As understood, FIG. 1 shows vias 102, 114 extending through buffer metal segment 110 and metal power line 122, respectively, for clarity purposes only. As shown best in FIG. 1, buffer metal segment 110 is substantially shorter in length than metal power line 122. For example, buffer metal segment 110 may have a length of less than approximately 10 micrometers (μm), while metal power line 122 may be 100 μm. It is understood that this example of a 10:1 difference is only illustrative and that the length of metal power line 122 may be in the range from 10 um to 1000 um or longer. High current device 104 may include any now known or later developed structure (e.g., transistor, resistor, on-chip heater, etc.) used in an IC that required a high power, e.g., >5 milli Watts (mW).

In one embodiment, as shown in FIG. 2, buffer metal segment 110 is positioned in a first metal layer 124 of an IC and metal power line 122 is positioned in a second metal layer 126 of the IC. Consequently, high current device 104 is a front-end-of-line (FEOL) level structure, e.g., a transistor.

However, IC interconnect 100 may also be applied at any back-end-of-line (BEOL) layer.

The metal of buffer metal segment 110 and metal power line 122 may be any conventional IC metal such as copper (Cu), aluminum (Al), etc. Dielectric 120 may include any now known or later developed BEOL interlevel dielectric including, but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), JSR (a spin-on silicon-carbon contained polymer material available form JSR Corporation), other low dielectric constant (<3.9) material, or layers thereof. Although referenced with a single numeral in the drawings, each dielectric layer 120 may not be identical. It is understood that other layers, e.g., cap layers and liners, have been omitted from the drawings for clarity.

In the FIGS. 1-2 embodiments, second vias 114 are arranged in a substantially straight line, i.e., between buffer metal segment 110 and metal power line 122. As also shown in FIG. 1 in phantom under metal power line 122, buffer metal segment 110 may have a T-shape to accommodate second vias 114 (shown best in FIG. 9 as 210). The arrows in the figures indicate the direction of electron current flow.

FIGS. 3-4 show embodiments in which second vias 114 are arranged such that a larger number of second vias 114 are positioned at an edge 140 of metal power line 122 than at a center 142 thereof. FIG. 3 shows top view, while FIG. 4 shows a cross-sectional view along line 4-4 in FIG. 3. This feature acts to distribute current away from a central location of metal power line 122, as will be described in more detail herein. In addition, FIGS. 3-4 show embodiments in which second vias 114 are arranged in a concave manner relative to buffer metal segment 210 such that a concave side 230 thereof faces buffer metal segment 110. While a particular concave arrangement of second vias 114 has been illustrated, other arrangements may also be possible with larger number of second vias 114 at an edge 140 of metal power line 122 than at center 142 thereof. Also, note that in this embodiment shown in FIG. 3, buffer metal segment 210 may include a portion 250 having non-parallel sides 252, e.g., diverging sides as it widens to the same width as metal power line 122. While a particular shape of buffer metal segment 210 has been illustrated, other shapes of buffer metal segment may also be possible. For example, see FIG. 9 where the buffer metal segment 210 may include a portion 254 having parallel sides 256.

FIGS. 5-6 show another embodiment in which second vias 114 are arranged in a concave manner relative to buffer metal segment 310 such that a concave side 330 thereof faces buffer metal segment 310. In this case, second vias 114 are arranged in an arc 332, and buffer metal segment 310 may include an arcuate end 334 (in phantom) under metal power line 122.

The above-described embodiments may be formed using any now known or later developed Damascene or dual Damascene techniques. In particular, as shown in FIG. 1, a method according to the disclosure may include forming a high current device 104, e.g., a transistor, or resistor, etc. First via 102 may be formed positioned in dielectric 120 and coupled to high current device 104 at one end 106. Buffer metal segment 110 may be formed positioned in dielectric 120 and coupled to first via 102 at the other end 108 thereof. First via 102 and buffer metal segment 110 may be formed simultaneously, or separately. Second vias 114 may be formed in any arrangement described above in dielectric 120 and are coupled to buffer metal segment 110 at one end 116 and to metal power line 122 at the other end 118 thereof. Second vias 114 and metal power line 122 may be formed simultaneously, or separately. As indicated above, buffer metal segment 110, 210, 310 is substantially shorter in length than metal power line 122. The second vias 114 forming may include arranging second vias 114 such that: as shown in FIG. 3, a larger number of the second vias are positioned at edge 140 of metal power line 122 than at center 142 thereof; or as shown in FIG. 1, arranging second vias 114 in a substantially straight line in metal power line 122; or as shown in FIG. 5, arranging second vias 114 in an arc 332 in metal power line 122, the arc having a concave side 330 thereof facing the buffer metal segment.

Figure 7:
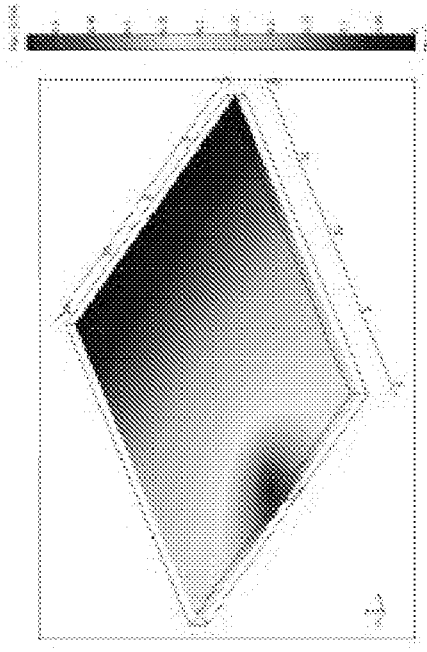
FIG. 7 shows a schematic diagram of a conventional IC interconnect.
Figure 8:
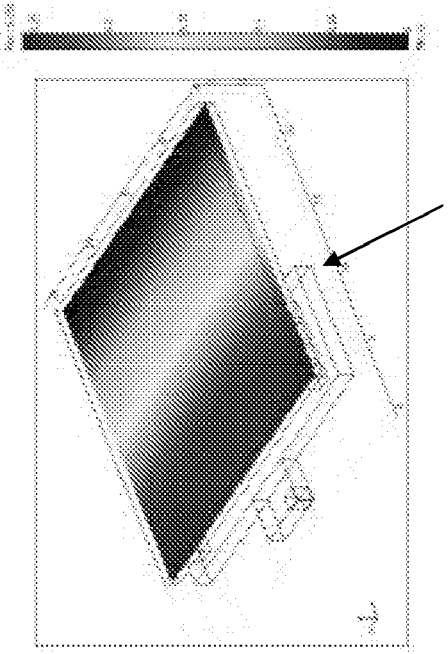
FIG. 8 shows a finite element modeling (FEM) simulation of current crowding in the FIG. 71C interconnect.

FIGS. 7-10 show schematic drawings illustrating the impact of IC interconnect 100. In particular, FIG. 7 shows a conventional IC interconnect 2 having a via 4 between a high current device (not shown, below via) and metal power line 6. FIG. 8 shows a finite element modeling (FEM) simulation of current crowding about via 4, which indicates current crowding near via 4 with a local maximum simulated electrical potential of, for example, 0.54 arbitrary units (au). This situation creates an electromigration problem.

Figure 9:
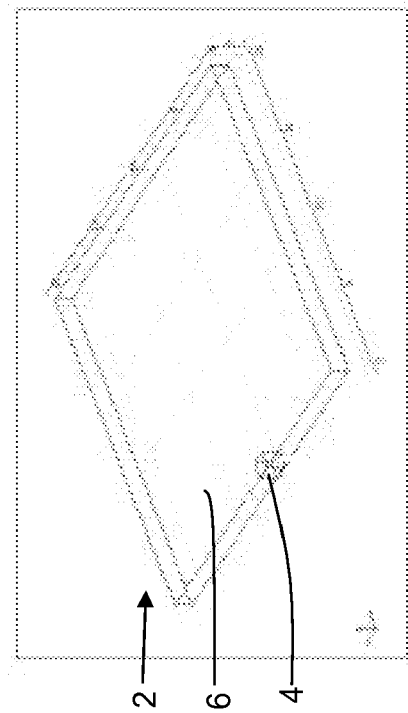
FIG. 9 shows a schematic diagram of an IC interconnect similar to FIG. 3.
Figure 10:
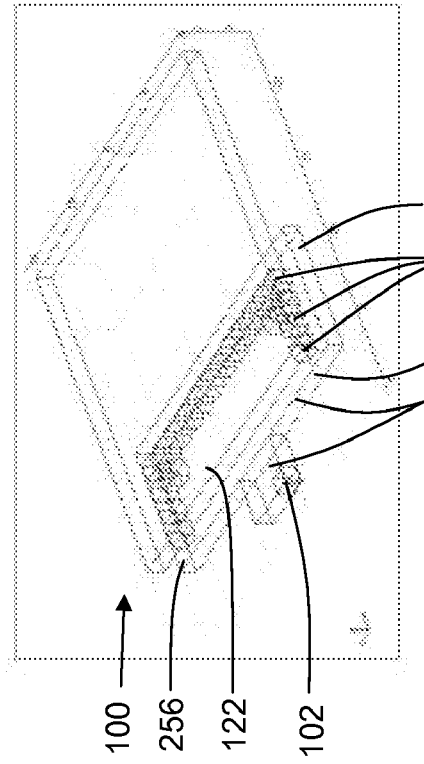
FIG. 10 shows an FEM simulation of current crowding in the FIG. 9 IC interconnect.

In contrast, FIG. 9 shows an embodiment similar to FIG. 3, with FIG. 10 showing an FEM simulation of current crowding therein where the local maximum simulated electrical potential is reduced to about 0.26 au. This disclosure realizes that shorter interconnects are less prone to electromigration degradation, which may be referred to as a "short-length" benefit, and implements buffer metal segment 110, 210, 310 in IC interconnects 100, as described herein, to take advantage of this realization. That is, buffer metal segment 110, 210, 310 interposed between high current device 104 (with high power and high temperature) and metal power line 122 protects metal power line 122 from electromigration damage based on the short-length benefit. Buffer metal segment 110, 210, 310 fundamentally increases the direct current (DC) current carrying capability of IC interconnect 100.

In addition, buffer metal segment 110, 210, 310 also allows relaxation of current density and temperature in metal power line 122. For example, IC interconnect 100 reduces local "hot spot" formation in metal power line 122, especially at the via/line interface. Electromigration reliability depends on the local current density and temperature at the flux divergence locations, such as second vias 114 and metal power line 122 interface. It is far more important to reduce the local current density and temperature at these locations, than reducing the global current density in the entire IC interconnect. As shown in FIG. 10, IC interconnect 100 also spreads current density distribution in metal power line 122. Electromigration reliability is very sensitive to local current density at the flux-divergent sites, e.g., cathode end 130 (FIG. 2) of metal power line 122. Therefore, avoiding current crowding in such locations is advantageous. Since current crowding occurs at the junction between two structures with very different widths, IC interconnect 100 may find applicability in a number of different severe current crowding situations such as, but not limited to: when a small via contacts a wide interconnect, or when a narrow line suddenly turns into wide line. Also, as shown in FIG. 2, another via 150 from buffer metal segment 110 can be employed back to a silicon device 152 (e.g., resistor etc) rather than only allowing the current to go upward.

Figure 11:
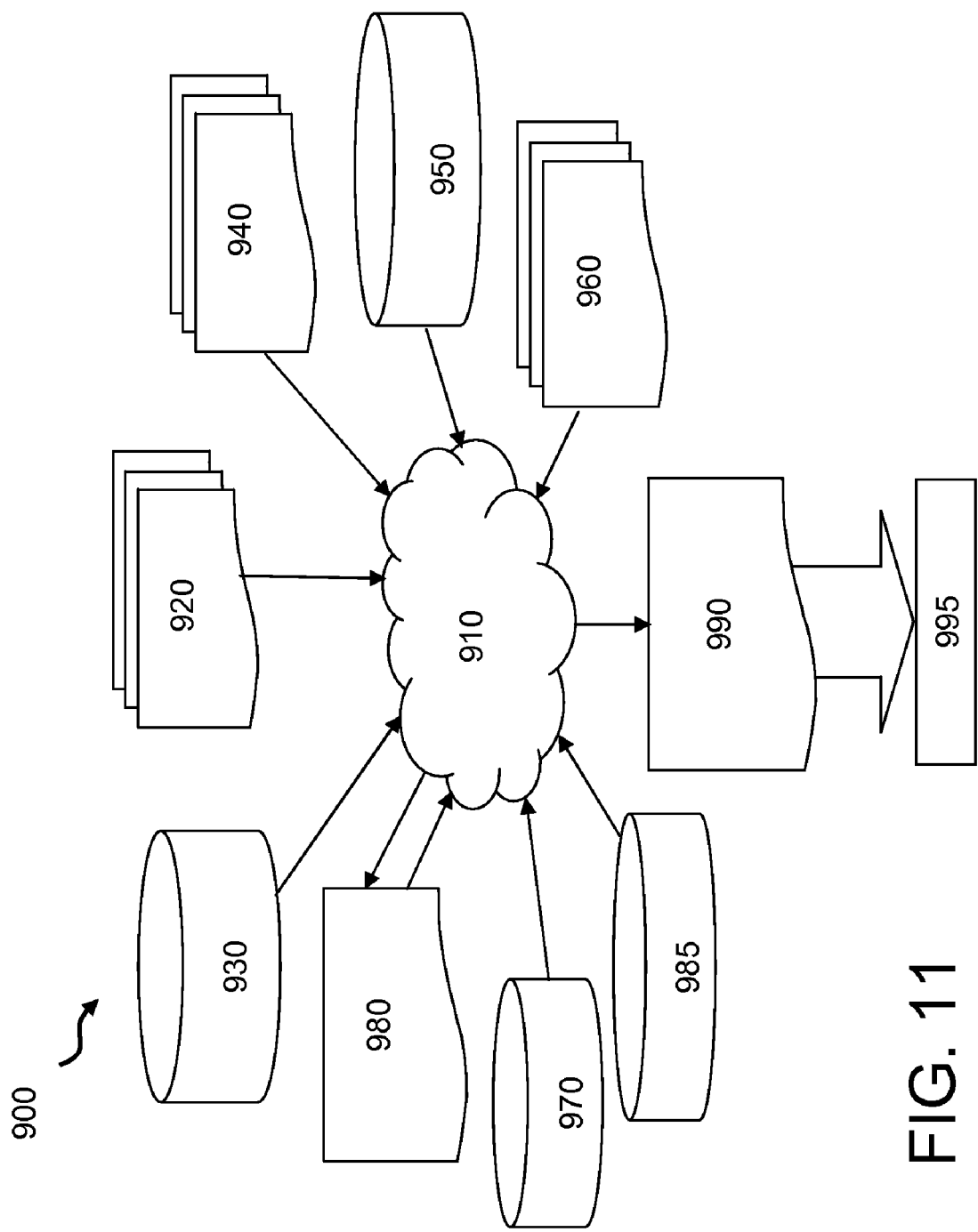
FIG. 11 shows a flow diagram of a design process used in semiconductor design, manufacturing, and/or test.

FIG. 11 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the disclosure as shown in FIGS. 1-6 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the disclosure as shown in FIGS. 1-6. Design process 910 preferably synthesizes (or translates) an embodiment of the disclosure as shown in FIGS. 1-6 into a netlist 980, where netlist 980 is, for example, a list of lines, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the disclosure. The design structure of the disclosure is not limited to any specific design flow.

Design process 910 preferably translates an embodiment of the disclosure as shown in FIGS. 1-6, along with any additional integrated circuit design or data (if applicable), into a second design structure 990. Design structure 990 resides on a storage medium in a data format used for the exchange of layout data of integrated circuits (e.g. information stored in a GDSII (GDS2), GL1, OASIS, or any other suitable format for storing such design structures). Design structure 990 may comprise information such as, for example, test data files, design content files, manufacturing data, layout parameters, lines, levels of metal, vias, shapes, data for routing through the manufacturing line, and any other data required by a semiconductor manufacturer to produce an embodiment of the disclosure as shown in FIGS. 1-6. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) interconnect comprising:
   a first via positioned in a dielectric and coupled to a high current device at one end;
   a buffer metal segment positioned in a dielectric and coupled to a top portion of the first via; and
   a plurality of second vias positioned in a dielectric and coupled to the buffer metal segment at a bottom end and to a metal power line at a top end thereof, wherein the first via is coupled to a first end of the buffer metal segment and the plurality of second vias are coupled to a second end of the buffer metal segment, such that the first via is horizontally off-set from all of the plurality of second vias,
   wherein the buffer metal segment is substantially shorter in length than the metal power line.

2. The IC interconnect of claim 1, wherein the plurality of second vias are arranged in a substantially straight line.

3. The IC interconnect of claim 1, wherein the plurality of second vias are arranged in a concave manner relative to the buffer metal segment such that a concave side thereof faces the buffer metal segment.

4. The IC interconnect of claim 1, wherein the plurality of second vias are arranged such that a larger number of the second vias are positioned at an edge of the metal power line than at a center thereof.

5. The IC interconnect of claim 1, wherein the buffer metal segment is positioned in a first metal layer of the IC and the metal power line is positioned in a second metal layer of the IC.

6. The IC interconnect of claim 1, wherein the buffer metal segment includes a portion having non-parallel sides.

7. The IC interconnect of claim 1, wherein the buffer metal segment has a T-shape.

* * * * *